United States Patent
Tsuchida et al.

(10) Patent No.: US 6,977,035 B2
(45) Date of Patent: Dec. 20, 2005

(54) METHOD FOR ELECTROLYTIC COPPER PLATING

(75) Inventors: Hideki Tsuchida, Hasuda (JP); Masaru Kusaka, Saitama (JP); Shinjiro Hayashi, Saitama (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/723,219

(22) Filed: Nov. 26, 2003

(65) Prior Publication Data
US 2004/0217008 A1    Nov. 4, 2004

(30) Foreign Application Priority Data
Nov. 28, 2002 (JP) .............................. 2002-345430

(51) Int. Cl.[7] ..................... C25D 21/16; C25D 21/18; C25D 3/38; B01D 17/06
(52) U.S. Cl. ..................... 205/98; 205/101; 205/118; 205/125; 205/291; 205/296; 210/748
(58) Field of Search ........................ 205/98, 101, 118, 205/125, 291, 296; 210/748

(56) References Cited

U.S. PATENT DOCUMENTS

| | | | |
|---|---|---|---|
| 5,151,170 A | 9/1992 | Montgomery et al. | 205/298 |
| 6,391,209 B1 * | 5/2002 | Belongia et al. | 210/748 |
| 6,444,110 B2 * | 9/2002 | Barstad et al. | 205/123 |
| 6,596,148 B1 | 7/2003 | Belongia et al. | 205/99 |

FOREIGN PATENT DOCUMENTS

| | | |
|---|---|---|
| EP | 1 069 211 A | 1/2001 |
| EP | 1 325 972 | 7/2003 |

OTHER PUBLICATIONS

Ozkok et al.; "A Method Towards Infinite Bath Life for Acid Copper Electrolytes"; IPC/HKPCA'S 2003 International Printed Circuit & Electronics Assembly Fair, no month.

* cited by examiner

*Primary Examiner*—Edna Wong
(74) *Attorney, Agent, or Firm*—S. Matthew Cairns

(57) ABSTRACT

A method for electrolytic copper plating using an electrolytic copper plating solution including a compound containing a structure of —X—S—Y—, wherein X and Y are independently chosen from hydrogen atom, carbon atom, sulfur atom, nitrogen atom, and oxygen atom, and X and Y may be the same only when they are a carbon atom, and by contacting the electrolytic copper plating solution with ozone is disclosed.

6 Claims, 1 Drawing Sheet

Figure 1
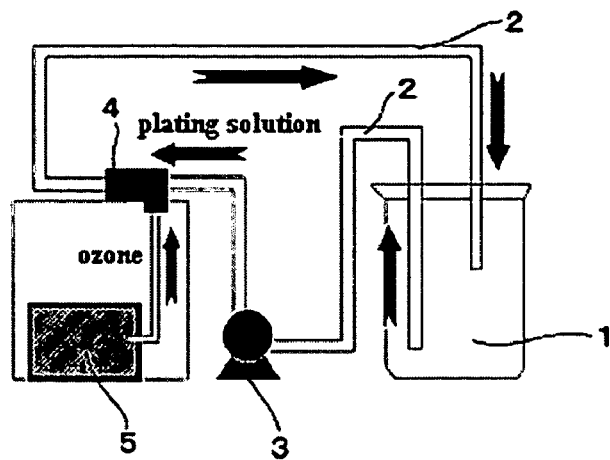
Figure 2
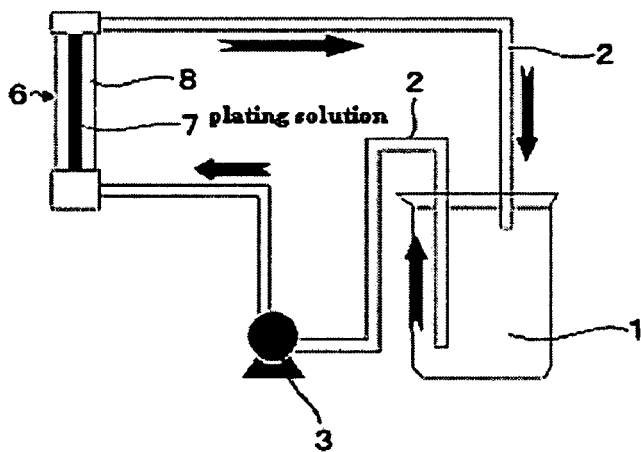
Figure 3
| | Practical Example 1 | Practical Example 2 | Practical Example 3 |
|---|---|---|---|
| Filling Status | | | |
| | Practical Example 4 | Practical Example 5 | Comparative Example 1 |
| Filling Status | | | |

METHOD FOR ELECTROLYTIC COPPER PLATING

BACKGROUND OF THE INVENTION

This invention relates to a new method for electrolytic copper plating, using an electrolytic copper plating solution containing a compound with a structure of —X—S—Y— and by contacting the electrolytic copper plating solution with ozone.

Due to increasing market demand on high-performance and small-size electronic devices, such as personal computers, printed circuit boards used in the electronic devices are required to have a high density and thin size. As one way to fulfill the demand, multilayer printed circuit boards or built-up printed circuit boards have been developed. In the built-up printed circuit board, multiple layers of circuit patterns are accumulated on the top of each other.

Recently, via-filling technology has been used in the built-up printed circuit board to increase the effective area of printed circuit board. When using the current technology, only the inner surface of a micro-via hole ("MVH") is coated with a conducting material to connect electronically two adjacent layers in the built-up printed circuit board. However, when using the via-filling technology, the entire MVH is filled with a conducting material to achieve sufficient conductivity even for MVH having a small diameter.

In such via-filling technology, MVHs can be filled by a printing method using a conducting paste or by selectively activating the bottom surface of MVH and then depositing copper in MVH by electroless copper plating or electrolytic copper plating. However, since the conducting paste is a mixture of copper with organic compounds and usually has a lower conductivity compared to copper metal, it is difficult to achieve a sufficient conductivity when the MVH has a small diameter. Therefore, the printing method using a conducting paste is not very effective for high-density and small-size built-up printed circuit boards. In addition, since the conducting paste usually has a high viscosity, it is very difficult to fill a small through hole with the printing method and the method always generates a void space. Electroless copper plating is better than printing a conducting paste, since a MVH is filled with copper deposit having a high conductivity. However, the rate of metal film deposition using electroless copper plating process is low, resulting in poor productivity. Even when using a high-speed electroless copper plating bath, the formation rate of a metal deposit film is only about 3 $\mu$m/hr. For example, it will take about 30 hours or longer to fill all the inner space of a typical blind via hole ("BVH") with a diameter of 100 $\mu$m and a depth of 100 $\mu$m.

On the other hand, however, the rate of a metal film deposition using an electrolytic copper plating process is about 10–50 $\mu$m/hr. The plating time can be shortened significantly compared to electroless copper plating processes. The use of electrolytic copper plating for via-filling in MVHs is highly expected. In order to fill the entire space of a MVH with a small diameter, the deposition rate of copper metal on the bottom part of MVH must be faster than the deposition rate of copper metal on the opening edge of MVH. If the deposition rate of copper metal on the bottom part is the same as or slower than the deposition rate of copper metal on the opening edge, the copper metal filling in the MVH cannot be achieved or a void space may remain in the MVH while the opening part is closed, potentially affecting the reliability of circuit boards.

Currently, in order to increase the deposition rate of copper metal on the bottom part of a MVH, a compound containing a structure of —X—S—Y— is added to the plating solution, and the electrolytic copper plating is carried out using direct current and a soluble phosphorus-containing copper anode. Under these conditions, however, good filling of a MVH can be obtained only when using a fresh plating solution. When the plating solution is used repeatedly, the plating solution becomes unstable. After a certain period of time, large aggregates may form during the formation of the electrolytic copper plating film, affecting performance and appearance of the plating film and reliability of via-filling.

The inventors carried out a series of studies to solve the problem described above. As a result, it was found that a compound with a structure of —X—S$^-$ is the cause of the problem. While not wishing to be bound by theory, it is believed that the formation of the compound containing the structure of —X—S$^-$ in the electrolytic copper plating solution is as follows. When using a soluble phosphorus-containing copper anode, the soluble anode may react with the sulfur-containing compound described above when the electrolysis is stopped and the single bonds S—X and S—Y of the sulfur-containing compound can be cleaved to form the compound with a structure of —X—S$^-$. Moreover, during the electrolytic copper plating process, the sulfur-containing compound may obtain an electron from the cathode, so that the single bond of S—X and S—Y of the sulfur-containing compound can be cleaved to form the compound with a structure of —X—S$^-$, or the sulfur-containing compound may obtain an electron when Cu is converted to Cu$^{2+}$ on the soluble anode, to form the compound with a structure of —X—S$^-$.

Further, while not intending to be bound by theory, it is believed that the compound containing the structure of —X—S$^-$ may further affect the electrolytic copper plating process through the following mechanism. Such compound may react with metal ions, such as Cu$^+$, Cu$^{2+}$, and the like, to form a complex and such complex may precipitate and result in the formation of large metal aggregates. These aggregates may affect the appearance and the performance, such as film attachment and heat resistance, of the copper film. Moreover, during the via-filling process, the complex reduces the metal deposition rate on the via bottom to the same level as or even lower than the metal deposition rate on the via opening. As a result, via filling becomes insufficient. Depending on the shape of via, a void may remain after the via opening is closed.

There is a continuing need for electrolytic copper plating solutions for the filling of MVHs that have good via-filling capability, and where such solutions provide deposits having good performance characteristics and appearance.

SUMMARY OF THE INVENTION

The inventors have surprisingly found that by contacting an electrolytic copper plating solution with ozone, the concentration of the compound containing a structure of —X—S$^-$ can be significantly reduced and the problems caused by the compound, such as poor plating film appearance, insufficient via filling, etc., can be solved.

Thus, this invention provides a method for electrolytic copper plating of a substrate, using an electrolytic copper plating solution including a compound containing a structure of —X—S—Y—, wherein X and Y are independently chosen from hydrogen atom, carbon atom, sulfur atom, nitrogen atom, and oxygen atom, and X and Y may be the same only when they are a carbon atom, and by contacting the electrolytic copper plating solution with ozone.

This invention also provides the method for electrolytic copper plating described above wherein the concentration of the compound containing the structure of —X—S⁻ in the electrolytic copper plating solution is controlled in the range of 1.0 μmol/L or lower.

This invention further provides the method for electrolytic copper plating described above, wherein the substrate is a printed circuit board or wafer, especially a substrate carrying through holes or via holes.

This invention still further provides a composite material prepared using the method described above.

BRIEF DESCRIPTION OF THE DRAWING

FIG. 1 is a schematic drawing of an example of the electrolytic copper plating system used in this invention.

FIG. 2 is a schematic drawing of another example of the electrolytic copper plating system used in this invention.

FIG. 3 is a schematic drawing for the cross-sections of via holes filled in Practical Examples 1–5 and Comparative Example 1.

DETAILED DESCRIPTION OF THE INVENTION

The present invention provides a method for electrolytic copper plating on a substrate including the steps of providing an electrolytic copper plating solution, and contacting the electrolytic copper plating solution with ozone. Such method may optionally include the step of contacting a substrate with the electrolytic copper plating solution and applying sufficient current density to deposit copper on the substrate. The present invention also provides a method of treating an electrolytic copper plating solution including the step of contacting the electrolytic copper plating solution with ozone. In this invention, the electrolytic copper plating treatment includes not only the electrolysis treatment of applying a current to an electrolytic copper plating solution but also any process carried out between two electrolysis treatments when the electrolysis treatment is carried out repeatedly. Preferably, the electrolytic copper plating treatment includes all treatments carried out between establishment of a fresh plating solution and abandonment of the plating solution after repeated use and regeneration.

In the method of this invention, there is no limitation on the methods used to contact the electrolytic copper plating solution with ozone. In one embodiment, ozone is bubbled through or mixed with the electrolytic copper plating solution. Alternatively, the electrolytic copper plating solution is irradiated with an ozone-generating UV light. A combination of methods can also be used.

The step of contacting of the electrolytic copper plating solution with ozone can be carried out at any stage of the electrolytic copper plating treatment. In one example, the electrolytic copper plating solution can be contacted with ozone continuously, regardless of whether a current is applied to the plating solution. In another example, ozone is supplied to the electrolytic copper plating solution only after the plating solution shows a sign of deterioration, such as poor appearance of plating film and insufficient via filling, such deterioration arising from repeated use of the electrolytic copper plating solution. When ozone is supplied to the electrolytic copper plating solution after the plating solution shows a sign of deterioration, preferably the electrolysis treatment is stopped and the ozone treatment of the electrolytic copper plating solution is carried out until the deteriorated plating solution is recovered, i.e. the level of the compound containing the structure —X—S⁻ is reduced such that the desired performance of the plating solution and/or the copper deposit is achieved.

The amount of the ozone used in the treatment of the electrolytic copper plating solution should be sufficient to prevent the deterioration of a plating solution or to recover a deteriorated plating solution. Such amount can be selected based on the type of the electrolytic copper plating solution, conditions used for the electrolytic copper plating treatment, degree of deterioration of the plating solution, and the method used to contact the plating solution with ozone, which are all determinations within the ability of one skilled in the art. Typically, the concentration of ozone in the electrolytic copper plating solution is in the range of 0.01 mg/L to 10 mg/L, more typically 0.05 mg/L to 5 mg/L, and still more typically 0.1 mg/L to 1 mg/L.

As a result of the present method, the electrolytic copper plating solution contains ozone. Since the electrolytic copper plating solution may contact ozone at any point during the electrolytic copper plating treatment, ozone may be present in the electrolytic copper plating solution at any point during the electrolytic copper plating treatment. In other words, ozone may be present in the electrolytic copper plating solution in both periods when current is applied and in periods when current is not applied to the solution, or ozone may be present in the electrolytic copper plating solution in either one of such periods when the current is applied or not applied to the solution.

Moreover, when the step of contacting the electrolytic copper plating solution with ozone is performed by bubbling ozone into the solution or mixing ozone with the solution, the bubbling or mixing process can be carried out with any common method using common equipment. For example, ozone can be directly bubbled into the solution or directly mixed with the solution. In one embodiment, a system having two tanks, one for electrolytic copper plating treatment and the other for ozone treatment of the electrolytic copper plating solution, may also be used. FIG. 1 shows an equipment system containing plating bath tank 1, circulating pipeline 2 for circulating an electrolytic copper plating solution with plating bath tank 1, circulating pump 3 on circulating pipeline 2, ozone mixer 4 for mixing ozone on circulating pipeline 2, and ozone generator 5 for supplying ozone to ozone mixer 4. When using the equipment system shown in FIG. 1, the electrolytic copper plating solution circulated from plating bath tank 1 through circulating pipeline 2 is mixed with ozone generated from ozone generator 5 at ozone mixer 4, and then the ozone-containing electrolytic copper plating solution is circulated back to plating bath tank 1 through circulating pipeline 2.

Typically, the ozone can be generated using conventional methods and equipment. Further, the ozone can be bubbled into or mixed with the electrolytic copper plating solution using conventional methods and equipment. There is no particular limitation on the methods and equipment used.

When ozone is supplied to an electrolytic copper plating solution through irradiation of the plating solution under UV light, sufficient UV irradiation should be used to form a sufficient amount of ozone in the electrolytic copper plating solution. The treatment can be carried out using conventional methods and equipment. There is no particular limitation on the methods and the equipment used. The UV light used to form ozone in the electrolytic copper plating solution can be any type of UV light, as long as a sufficient amount of ozone can be formed in the electrolytic copper plating solution. Typically, a UV light with a wavelength of 185 nm or lower is suitably used for forming ozone. There is no particular limitation on the equipment used to generate the UV light, as long as the UV light is suitable for ozone formation. Any types of UV lamps, such as low pressure, medium pressure, and high pressure, can be used. The UV light generated from the lamp can be used directly or through a filter to irradiate the electrolytic copper plating solution.

The UV lamp should be installed at suitable places, so that the electrolytic copper plating solution can be irradiated with a sufficient amount of UV light to form a sufficient amount of ozone. In general, the amount of UV light required to form a sufficient amount of ozone can be determined based on the conditions used for the treatment. For example, the UV lamp can be installed in the plating bath tank or outside the plating bath tank. A system containing two tanks, one for electrolytic copper plating and the other for UV irradiation to form ozone, can also be used for this purpose. FIG. 2 shows an equipment system consisting of plating bath tank 1, circulating pipeline 2 for circulating an electrolytic copper plating solution with plating bath tank 1, circulating pump 3 on circulating pipeline 2, and UV irradiation chamber 6 installed on circulating pipeline 2 and equipped with UV lamp 7 in the center for ozone formation and water pathway 8 around UV lamp 7 for passing the electrolytic copper plating solution. When using the equipment system shown in FIG. 2, the electrolytic copper plating solution circulated from plating bath tank 1 through circulating pipeline 2 is irradiated with UV light in UV irradiation chamber 6 to form ozone, and then the ozone-containing electrolytic copper plating solution is circulated back to plating bath tank 1 through circulating pipeline 2.

The ozone-containing electrolytic copper plating solution can also be irradiated by a UV light different from the ozone-forming UV light. In this case, the new UV light may interact with the ozone present in the electrolytic copper plating solution to form a hydroxyl radical, which is a very strong oxidizing agent. As a result, the oxidative effect of ozone can be further improved. In fact, when the electrolytic copper plating solution is irradiated with ozone-forming UV light, the UV light may actually provide effects of both forming ozone and improving the oxidizing effect.

Suitable electrolytic copper plating solutions contains a compound containing a structure of —X—S—Y—, wherein X and Y are independently chosen from hydrogen atom, carbon atom, nitrogen atom, sulfur atom, and oxygen atom. In this specification, the compound described above is exemplified below as the sulfur-containing compound, however, it will be appreciated by those skilled in the art that the same discussion is applicable to compounds containing the other atoms described above. For the sulfur-containing compound, preferably, X and Y are independent of each other and denote an atom selected from hydrogen atom, carbon atom, nitrogen atom, and sulfur atom. More preferably, X and Y are independent of each other and denote an atom selected from hydrogen atom, carbon atom, and sulfur atom, and X and Y may the same only when they denote a carbon atom.

In the formula —X—S—Y—, S has an atomic valence of 2. However, the atoms represented X and Y may not necessarily have an atomic valence of 2. Instead, the atomic valence of the atoms represented X and Y is dependent on the nature of the atoms. For example, when X is a hydrogen atom, the compound has a structure of H—S—Y—. Preferably, the sulfur-containing compound may further carry a sulfonic acid group or an alkali-metal sulfonate salt group in the molecule. The compound may carry one or more sulfonic acid groups or alkali-metal sulfonate salt groups.

In one embodiment, the sulfur-containing compound has a structure of —S—$CH_2$O—R—$SO_3$M or —S—R—$SO_3$M in the molecule, wherein M is a hydrogen atom or an alkali metal atom; and R is an alkyl group containing 3–8 carbon atoms. Exemplary sulfur-containing compounds include, but are not limited to, those represented by formulas (1)–(8):

(1) M—$SO_3$—$(CH_2)_a$—S—$(CH_2)_b$—$SO_3$—M;
(2) M—$SO_3$—$(CH_2)_a$—O—$CH_2$—S—$CH_2$—O—$(CH_2)_b$—$SO_3$—M;
(3) M—$SO_3$—$(CH_2)_a$—S—S—$(CH_2)_b$—$SO_3$—M;
(4) M—$SO_3$—$(CH_2)_a$—O—$CH_2$—S—S—$CH_2$—O—$(CH_2)_b$—$SO_3$—M;
(5) M—$SO_3$—$(CH_2)_a$—S—C(=S)—S—$(CH_2)_b$—$SO_3$—M;
(6) M—$SO_3$—$(CH_2)_a$—O—$CH_2$—S—C(=S)—S—$CH_2$—O—$(CH_2)_b$—$SO_3$—M;
(7) X—S—$(CH_2)_a$—$SO_3$—M; and
(8) X—S—$CH_2$—O—$(CH_2)_a$—$SO_3$—M;

wherein M is chosen from a hydrogen atom and an alkali metal; X is chosen from a hydrogen atom, an alkyl group containing 1–10 carbon atoms, an aryl group, a linear or cyclic amino group containing 1–6 nitrogen atoms, 1–20 carbon atoms, and multiple hydrogen atoms, or a hetero cyclic group containing 1–2 sulfur atoms, 1–6 nitrogen atoms, 1–20 carbon atoms, and multiple hydrogen atoms; and a and b are independently an integer of 3–8.

The sulfur-containing compound is usually used as a brightening agent. However, the use of the sulfur-containing compound for the purposes other than a brightening agent is also contemplated by this invention. As a brightening agent, these sulfur-containing compounds can be used alone or as a mixture containing two or more of them.

When used as a brightening agent, the concentration of the sulfur-containing compound in the electrolytic copper plating solution may vary across a wide range, but is typically in the range of 0.1–100 mg/L, and more typically 0.5–10 mg/L. In terms of promoting growth of the copper plating film, the concentration of the sulfur-containing compound is typically in the range of 0.1 mg/L or higher. In the consideration of productivity and cost, however, the concentration of the sulfur-containing compound is typically in the range of 100 mg/L or lower. When the sulfur-containing compound is used for purposes other than a brightening agent, the concentration of the sulfur-containing compound will be determined based on the purpose.

The inventors found that the increased concentration of compounds containing the structure —X—S⁻ or —Y—S⁻ in the electrolytic copper plating solution causes insufficient via filling and poor appearance of the plating film. In other words, the problems mentioned above are due to deterioration of the electrolytic copper plating solution. In this invention, X and Y in the sulfur-containing compound can be switched. For example, for brightening agent (1) with a structure of M—$SO_3$—$(CH_2)_a$—S—$(CH_2)_b$—$SO_3$—M, the decomposition product can be either M—$SO_3$—$(CH_2)_a$—S⁻ or ⁻S—$(CH_2)_b$—$SO_3$—M, which is noted as —X—S⁻ or —Y—S⁻. In this specification, both sulfur-containing decomposition products are noted as —X—S⁻ for the sake of convenience.

Without wishing to be bound by theory, it is believed that the decomposition product —X—S⁻ present in the electrolytic copper plating solution is formed by cleaving the single bond X—S or S—Y of sulfur-containing compound —X—S—Y—. In this specification, the decomposition product includes both a compound with other part of the molecule connecting to X intact and a compound with other part of the molecule further decomposed in addition to the cleaved part of X—S⁻ as well as a mixture of these compounds.

The concentration of decomposition product —X—S⁻ in the electrolytic copper plating solution can be determined using conventional means, for example, high performance liquid chromatography. When using high performance liquid chromatography, the electrolytic copper plating solution can be directly injected into a high performance liquid chromatograph. If other components present in the electrolytic copper plating solution affect the determination, the plating solution can be first treated to remove the interfering components.

When decomposition product —X—S⁻ is a single compound, the concentration of the compound containing the structure of —X—S⁻ is the concentration of the decomposition product in the electrolytic copper plating solution. When decomposition product —X—S⁻ is a mixture, the concentration of the compound containing the structure of —X—S⁻ is the total concentration of all decomposition products in the electrolytic copper plating solution. The concentrations of sulfur-containing compound —X—S—Y— and decomposition product —X—S⁻ in the electrolytic copper plating solution can be evaluated by a variety of methods, such as with cyclic voltammetry stripping (CVS). The CVS method has been used to calculate indirectly the quantities of additives, such as brightening agent, etc., through electrochemical determination of the amount of plating deposition.

The decomposition product —X—S⁻ is usually present in the electrolytic copper plating solution as an ion pair with a metal ion or a hydronium ion. Therefore, except for a special case when the effective mechanism of compound —X—S⁻ is considered, compound —X—S⁻ should also include compound —X—S—H.

In the method of this invention, the concentration of compound —X—S⁻ in the electrolytic copper plating solution should be in the range of 2.0 $\mu$mol/L or lower, preferably 1.0 $\mu$mol/L or lower, more preferably 0.5 $\mu$mol/L or lower, to obtain a brightening appearance of the copper plating film. The concentration of the compound —X—S⁻ in the electrolytic copper plating solution should be controlled in the range described above through a pre-treatment of the electrolytic copper plating solution. In general, in order to achieve sufficient via filling, the concentration of compound —X—S⁻ in the electrolytic copper plating solution should be in the range of 0.15 $\mu$mol/L or lower, preferably 0.1 $\mu$mol/L or lower. The concentration of compound —X—S⁻ in the electrolytic copper plating solution should be controlled in the range described above through a pre-treatment of the electrolytic copper plating solution.

Any electrolytic copper plating solution may be used with the present invention. The plating solution can be any type of electrolytic copper plating solution, as long as the plating solution can be used for electrolytic copper plating. Examples of the electrolytic copper plating solution include, without limitation, copper sulfate plating solution, copper cyanate plating solution, and copper pyrophosphate plating solution. It is preferable to use a copper sulfate plating solution. In the following explanation, the copper sulfate plating solution is used as an example of the electrolytic copper plating solution. It will be appreciated that such discussion applies to other electrolytic copper plating solutions. Based on the composition of the copper sulfate plating solution listed in the following practical examples as well as the information from the literature, the composition of other types of electrolytic copper plating solutions can be easily determined, if necessary.

There is no particular limitation on the basic composition of the electrolytic copper plating solution. The basic composition can be the same as the composition commonly used in industry. In order to achieve the goal of this invention, the composition, the concentration, and the use of additives may be modified. When using a copper sulfate plating solution, an aqueous solution with the basic composition containing sulfuric acid, copper sulfate, a water-soluble chloride, etc., is very suitable for the purpose of this invention.

The concentration of sulfuric acid in the copper sulfate plating solution is typically in the range of 30–400 g/L, and preferably 170–210 g/L, although other suitable amounts may be used. The concentration of copper sulfate in the copper sulfate plating solution is typically in the range of 20–250 g/L, and preferably 60–180 g/L, although other suitable amounts may be used.

The water-soluble chloride present in the copper sulfate plating solution can be any chloride commonly used in the copper sulfate plating solution. There is no particular limitation on the chloride in this invention. The water-soluble chloride can be, for example, hydrochloric acid, sodium chloride, potassium chloride, ammonium chloride, etc. The water-soluble chlorides can be used alone or as a mixture containing two or more of them. The concentration of the water-soluble chloride in the copper sulfate plating solution is typically in the range of 10–200 mg/L, and preferably 30–80 mg/L, calculated as chloride ion.

The electrolytic copper plating solution may optionally contain a surfactant. Any surfactant commonly used as an additive for an electrolytic copper plating solution is suitable for this purpose. Exemplary surfactants include, but are not limited to, compounds of the following formulaas (9)–(13).

(9) HO—(CH$_2$—CH$_2$—O)$_a$—H, wherein a is an integer of 5–500;

(10) HO—(CH$_2$—CH(CH$_3$)—O)$_a$—H, wherein a is an integer of 5–200;

(11) HO—(CH$_2$—CH$_2$—O)$_a$—(CH$_2$—CH(CH$_3$)—O)$_b$—(CH$_2$—CH$_2$ —O)$_c$—H, wherein a and c are integers; a+c=an integer of 5–250, and b=an integer of 1–100;

(12) —(NH$_2$CH$_2$CH$_2$)$_n$—, wherein n=5–500; and

(13) CH$_3$—CH$_2$—C{—CH$_2$—[O—CH$_2$—CH(CH$_3$)]$_a$—NH$_2$}{—CH$_2$—[O—CH$_2$—CH(CH$_3$)]$_b$—NH2}{—CH$_2$—[O—CH$_2$—CH(CH$_3$)]$_c$—NH$_2$},
wherein a, b, and c are independently integers of 5–200.

These surfactants can be used alone or as a mixture containing two or more of them. The concentration of the surfactant in the electrolytic copper plating solution may vary over a wide range, but is typically in the range of 0.05–10 g/L, and preferably 0.1–5 g/L.

In this invention, there is no particular limitation on the material and the shape of the plating substrate, as long as the plating substrate is strong enough to survive the conditions used in the present method and is suitable for the formation of a metal plating film on the surface. The material for the plating substrate can be, for example, resin, ceramic, metal, etc. The plating substrate made of a resin can be, for example, a printed circuit board. The plating substrate made of a ceramic material can be, for example, a semiconductor wafer. The metal can be, for example, silicon, and the plating substrate made of a metal can be, for example, a silicon wafer. Since the method of this invention is particularly effective in terms of filling via holes, the plating substrate is preferably a plating substrate having through holes and/or via holes, particularly a printed circuit board or wafer having through holes and/or via holes.

Suitable resin material used for the plating substrate includes, without limitation, a thermoplastic resin, including a polyethylene resin such as high-density polyethylene, medium-density polyethylene, branched low-density polyethylene, linear low-density polyethylene, and high molecular weight polyethylene; a polyolefin resin such as polypropylene, polybutadiene, polybutene, polybutylene, and polystyrene; a halogen-containing polymer resin such as polyvinyl chloride, polyvinylidene chloride, vinyl chloride/vinylidene chloride copolymer, polyethylene chloride, polypropylene chloride, and polytetrafluoroethylene; AS resin; ABS resin; MBS resin; polyvinyl alcohol; a polyacrylate resin such as poly(methyl acrylate); a polymethacrylate resin such as poly(methyl methacrylate), and methyl methacrylate/styrene copolymer; maleic anhydride/styrene copolymer; polyvinyl acetate; a cellulose resin such as cellulose propionate, and cellulose acetate; an epoxy resin; a polyimide resin; a polyamide resin such as nylon; a poly(amide imide) resin; a polyarylate resin; a poly(ether imide) resin; a poly(ether ether ketone) resin; a poly(ethylene oxide) resin; a polyester resin such as PET; a polycarbonate resin; a polysulfone resin; a poly(vinyl ether) resin; poly(vinyl butyral); a poly(phenylene ether) resin such as poly(phenylene oxide); a poly(phenylene sulfide) resin; poly(butylene terephthalate); polymethylpentene; polyacetal; vinyl chloride/vinyl acetate copolymer; ethylene/vinyl acetate copolymer; ethylene/vinyl chloride copolymer; as well as a thermosetting resin, including epoxy resins; xylene resins; guanamine resins; diallyl phthalate resins; vinyl ester resins; phenol resins; unsaturated polyester resins; furan resins; polyimide resins; polyurethane resins; maleic acid resins; melamine resins; and urea resins. A grafted copolymer, a blend, and a mixture of these polymeric resin materials may also used. However, the resin material is preferably chosen from an epoxy resin, a polyimide resin, a polyvinyl resin, a phenol resin, a nylon resin, a poly(phenylene ether) resin, a polypropylene resin, a fluorine-containing resin, and ABS resin, and more preferably an epoxy resin, a polyimide resin, a poly(phenylene ether) resin, a fluorine-containing resin, and ABS resin. Most preferably, the resin material is chosen from an epoxy resin and a polyimide resin. The resin-based plating substrate may be formed by a single resin material or by multiple resin materials. Moreover, a composite material formed by coating or laminating a resin material onto other materials may also be used for the plating substrate. The plating substrate may be formed by a resin material but reinforced by a reinforcing material, such as glass fiber, or by coating a resin material on a base body made from ceramic, glass, metal, etc.

Exemplary ceramic material used for the plating substrate include, but are not limited to, an oxide-based ceramic such as alumina ($Al_2O_3$), steatite ($MgO.SiO_2$), forsterite ($2MgO.SiO_2$), mullite ($3Al_2O_3.2SiO_2$), magnesia (MgO), spinel ($MgO.Al_2O_3$), and beryllia (BeO); or a non-oxide-based ceramic such as aluminum nitride, and silicon carbide; or a low-temperature sintered ceramic, such as glass ceramic.

The plating substrate used in the electrolytic copper plating method of this invention must have conductivity on the surface area to be plated. Such conductivity may be supplied by pre-treating the substrate. For example, when a MVH needs to be filled with copper metal through electrolytic copper plating with the method of this invention, the inner surface of MVH must be treated for conductivity. The conductivity treatment can be carried out with any conventional method, such as electroless copper plating, direct plating, adsorption of conductive microparticles, and gas-phase plating.

The plating solution temperature (plating bath temperature) for the electrolytic copper plating treatment is determined based on the type of the plating solution. A wide range of temperatures may be used, but typically the temperature is in the range of 10–40° C., and preferably 20–30° C. Although temperatures lower than 10° C. may be used, the plating solution may have a low conductivity, resulting in slow formation of the plating film. Therefore, the plating temperature should be higher than 10° C. Although temperatures higher than 40° C. may be used, the brightening agent present in the plating solution may decompose.

Any type of current commonly used for the electrolysis, such as direct current, pulse periodic reverse (PPR) current, and the like, may be used. The anode current density should be selected based on the type of plating bath and is typically in the range of 0.1–10 A/dm$^2$, and preferably 1–3 A/dm$^2$. Since a very large anode area will result in a high cost, it is preferable to use a current density in the range of 0.1 A/dm$^2$ or higher. It is advantageous to control the current density in the range of 10 A/dm$^2$ or lower in order to prevent oxidative decomposition of additives, such as brightening agent, by the oxygen generated from anode during electrolysis.

Any type of anode, such as soluble anode and insoluble anode, may be used with the present invention. The soluble anode can be, for example, soluble phosphorus-containing anode. The insoluble anode can be, for example, insoluble anodes made from iridium oxide, platinum-plated titanium, platinum, graphite, ferrite, lead dioxide, platinum-oxide-coated titanium, and stainless steel.

The electrolytic copper plating treatment can be carried out with or without stirring. It is preferable to stir the plating solution. Such stirring provides uniform supply for both copper ion and additives to the plating surface. The stirring can be carried out using air or jet flow. In consideration of increasing the concentration of dissolved oxygen, stirring with air should be used. A combination of stirring with air and jet stirring may also be used. Additionally, the electrolytic copper plating solution may be filtered, such as by using a circulating filtration system. The circulating filtration system is able to remove dust, precipitates, and the like, and improve the uniformity of solution temperature.

When a plating substrate is contacted with electrolytic copper plating using the method of this invention, a composite material having a copper film on the plating substrate can be obtained. By using the electrolytic copper plating method of this invention, the electrolytic copper plating solution can be used repeatedly without forming copper aggregates. As a result, a tight and fine copper plating film can be obtained and via-filling can also be performed effectively leaving no voids in the vias.

In the following examples, this invention is explained in more detail. However, these examples should not be considered as limitations of this invention.

PRACTICAL EXAMPLES

Practical Example 1

Bubbling Ozone Through the Electrolytic Copper Plating Solution

By using the equipment shown in FIG. 1, the experiment was carried out by bubbling ozone into a simulated electrolytic copper plating solution with deteriorated via filling performance by following steps 1–4. The recovery of the electrolytic copper plating solution was evaluated.

Step 1: An electrolytic copper plating bath with a standard composition for via filling, 10 L, was prepared. Then, 3-mercapto-1-propanesulfonic acid sodium salt ("MPS"), 1 mg/L, was added to give a simulated electrolytic copper plating bath with deteriorated via filling performance. The CVS value was measured using a CVS measuring instrument QP-4000 (ECI Company, USA) as an index for the amounts of MPS and SPS in the simulated bath. As an index for the amounts of MPS and bis(3-sulfopropyl)disulfide disodium salt ("SPS"), the CVS value was converted to the content of SPS in mg/L in the practical examples.

Step 2: The circulating pump was operated through the circulating pipeline connecting to the plating bath tank to achieve a flow of 4.8 L/min for the electrolytic copper plating solution. A system capable of generating an aqueous ozone solution, V-3500A (Toseme Co., Ltd.), equipped with an ozone generator and an ozone mixer, was used to generate an aqueous solution of ozone with a concentration of about 0.1 mg/L, which was then mixed into the electrolytic copper plating solution circulated in the pipeline. If necessary, the electrolytic copper plating solution was sampled at a certain time interval to determine the CVS value.

Step 3: By using the electrolytic copper plating solution 1 hour after the aqueous ozone solution was mixed, electrolytic copper plating treatment was carried out using direct current for a printed circuit board specially designed for evaluation and carrying 100 via holes. Moreover, the circulation of the electrolytic copper plating solution and the addition of the aqueous ozone solution were stopped during the electrolytic copper plating treatment.

Step 4: The via filling status was observed with the cross-section method.

Comparative Example 1

Immediately after Step 1, electrolytic copper plating treatment was carried out using direct current for a printed circuit board specially designed for evaluation and carrying 100 via holes. The via filling status was observed with the cross-section method. No ozone treatment was performed.

Simulated Copper Plating Bath Composition

The composition of the simulated electrolytic copper plating bath with deteriorated via filling performance used in Practical Example 1 and Comparative Example 1 was as follows. The bath temperature was 24–25° C.

| | |
|---|---|
| $CuSO_4 \cdot 5H_2O$ | 200 g/L |
| $H_2SO_4$ | 100 g/L |
| $Cl^-$ | 50 mg/L |
| SPS | 5 mg/L |
| Amine-based surfactant | 1500 mg/L |
| MPS | 1 mg/L |

Direct Current Electrolysis Conditions

| | |
|---|---|
| Current density: | 2 A/dm² |
| Temperature: | 20° C. |
| Time: | 60 min |

Printed circuit board for evaluation: via diameter 120 micron/depth 60 micron

When the printed circuit board for evaluation carrying 100 via holes was treated with the treatment described above, almost all 100 via holes in Practical Example 1 were filled sufficiently, while almost all 100 via holes in Comparative Example 1 were not filled. FIG. 3 shows the schematic drawings for the via filling status of the via holes treated in Practical Example 1 and Comparative Example 1. Therefore, the method of this invention is able to provide excellent via filling performance, while the method used in the comparative example has poor via filling performance.

Further, the via holes filled in Practical Example 1 showed smooth and bright appearance, while the via holes obtained in Comparative Example 1 showed poor appearance.

The CVS value was 3.515 (SPS mg/L) for the fresh bath (Comparative Example 1) and became almost 0 (SPS mg/L) after bubbling ozone for 30 minutes (Practical Example 1). The result clearly suggests that the CVS value can be significantly improved by bubbling ozone into the electrolytic copper plating solution.

Based on the via filling results obtained above, it can be concluded that the decrease of the CVS value in Practical Example 1 is due to the ozone-induced decrease of the concentration of MPS, which is able to cause deterioration of the via filling performance of the electrolytic copper plating solution. In other words, decrease of the CVS value is correlated to the decrease of the concentration of MPS present in the electrolytic copper plating solution.

Practical Example 2

Irradiation of the Electrolytic Copper Plating Solution with Ozone-generating UV Light An equipment system shown in FIG. 2 was used in Practical Example 2. The system was equipped with a low-pressure 185-nm mercury lamp (output 15 W, UVL 15DS-33, Sen Special Light Source Co., Ltd.), a UV irradiation chamber with a volume of 0.89 L, and a plating bath tank 3 L. The experiment was carried out by bubbling air into the plating bath at a flow rate of 9 L/min and circulating the electrolytic copper plating solution through the circulating pipeline at a flow rate of 9 L/min, and the electrolytic copper plating solution was irradiation with a UV light in the UV irradiation chamber. The other conditions were the same as in Practical Example 1. The UV irradiation and air bubbling were carried out for 44 hours. After 44 hours, the electrolytic copper plating solution was used for electrolytic copper plating and the via filling performance was evaluated. The amount of the ozone generated during the experiment was about 0.3 mg/L calculated on the output from the UV lamp.

The CVS values at different time points during the experiment in Practical Example 2 are shown in Table 1.

TABLE 1

| Time after bath establishment (hour) | CVS value (SPS mg/L) Practical Example 2 |
|---|---|
| 0 | 3.846 |
| 1 | 2.681 |
| 2 | 2.277 |
| 3 | 1.819 |
| 4 | 1.365 |
| 5 | 1.277 |
| 7.5 | 0.852 |

TABLE 1-continued

| Time after bath establishment (hour) | CVS value (SPS mg/L) Practical Example 2 |
|---|---|
| 10 | 0.682 |
| 15 | 0.476 |
| 17.5 | 0.415 |
| 20 | 0.362 |
| 25 | 0.291 |
| 27.5 | 0.291 |
| 30 | 0.197 |
| 34 | 0.359 |
| 39 | 0.316 |
| 44 | 0.331 |

As shown in Table 1, under the irradiation of ozone-generating UV light at 185 nm, the CVS value of the electrolytic copper plating solution was decreased significantly (about 91% in 44 hours).

FIG. 3 shows the schematic drawings for the via filling status of the via holes treated in Practical Example 2. Therefore, the method of this invention is able to provide excellent via filling performance. Further, the via holes filled in Practical Example 2 showed smooth and bright appearance.

Practical Examples 3 and 4

Bubbling Ozone Through the Electrolytic Copper Plating Solution

The same irradiation chamber as in Practical Example 2 was used in Practical Examples 3 and 4. The irradiation chamber was installed after the ozone mixer on the circulating pipeline in the equipment system shown in FIG. 1. The experiment was carried out under the same conditions as in Practical Example 1. In Practical Examples 3 and 4, due to the use of the UV irradiation chamber, the circulating pipeline for the electrolytic copper plating solution was longer than that of Practical Example 1. UV irradiation was not carried out in Practical Example 3 but was carried out in Practical Example 4 using a 254-nm UV lamp (a low-output and low-pressure 254 nm mercury lamp/output 15 W, UVL 15DH-33, Sen Special Light Source Co., Ltd.) for the electrolytic copper plating solution in the irradiation chamber. The ozone bubbling time was 5 hours. After 5 hours of bubbling, the electrolytic copper plating solution was evaluated for via filling performance.

The CVS values at different time points during the experiment in Practical Examples 3 and 4 are shown in Table 2.

TABLE 2

| Time after bath establishment (hour) | CVS value (SPS mg/L) | |
|---|---|---|
| | Practical Example 3 | Practical Example 4 |
| 0 | 3.600 | 3.699 |
| 0.25 | | 2.035 |
| 0.5 | 1.850 | 1.434 |
| 0.75 | | 0.993 |
| 1 | 0.931 | 0.639 |
| 1.5 | | 0.418 |
| 2 | 0.158 | 0.170 |
| 3 | 0.208 | 0.125 |
| 4 | 0.074 | 0.079 |
| 5 | 0.130 | 0.048 |

As shown in Table 2, in both Practical Examples 3 and 4 with ozone bubbling, the CVS value of the electrolytic copper plating solution decreased significantly. In Practical Example 4, UV irradiation was carried out at 254 nm for the electrolytic copper plating solution in addition to the ozone bubbling. The CVS value was further reduced compared to Practical Example 3. The result can be explained by the fact that the UV lamp used in Practical Example 4 had both functions of generating ozone and generating hydroxyl radicals in the presence of ozone in the electrolytic copper plating solution.

The decrease of the CVS value achieved in Practical Example 3 was not as significant as in Practical Example 1. The reason for the difference is unclear. One possible explanation is that the circulating pipeline used in Practical Example 3 is longer than that used in Practical Example 1.

FIG. 3 shows schematic drawings for the via-filling status of the via holes treated for 5 hours in Practical Examples 3 and 4. Therefore, the method of this invention is able to provide excellent via-filling performance. Moreover, the via holes filled in Practical Examples 3 and 4 showed smooth and bright appearance.

Practical Example 5

Recovery of Via Filling Performance of a Simulated Electrolytic Copper Plating Bath Containing Only MPS In Practical Example 5, except for using a simulated electrolytic copper plating bath with deteriorated via-filling performance and having the composition listed below, the experiment was carried out with the same method as in Practical Example 1. The ozone was bubbled for 2 hours. Different from other practical examples and comparative examples, the CVS value was converted to the MPS content (MPS mg/L) in Practical Example 5.

The composition of the simulated electrolytic copper plating bath used in Practical Example 5 is as follows.

| | |
|---|---|
| $CuSO_4 \cdot 5H_2O$ | 200 g/L |
| $H_2SO_4$ | 100 g/L |
| $Cl^-$ | 50 mg/L |
| MPS | 1 mg/L |

When expressed as the MPS content, the CVS value for the fresh plating bath was 1.840 (MPS mg/L). After 1 hour, the value was reduced significantly to 0.008 (MPS mg/L).

FIG. 3 shows schematic drawings for the via-filling status of the via holes treated for 2 hours in Practical Example 5. Therefore, the method of this invention is able to provide excellent via-filling performance. Additionally, the via holes filled in the practical example had a smooth and bright appearance.

Significance of the Invention

As described above, the method of this invention for electrolytic copper plating is carried out in the presence of ozone. As a result, the content of the decomposition product, which is generated from the sulfur-containing compound and is the major cause for the time-dependent instability of the electrolytic copper plating bath, can be effectively reduced. The method of this invention is very effective in terms of reducing the content of the decomposition product generated from the sulfur-containing compound. Therefore, poor appearance of the plating film caused by aggregates and insufficient via filling due to the instability of the electrolytic copper plating bath can be significantly improved by using the method of this invention.

Explanation for the Reference Numerals

1 Plating bath
2 Circulating pipeline
3 Pump
4 Ozone mixer
5 Ozone generator
6 UV light irradiation chamber
7 UV lamp
8 Water pathway

What is claimed is:

1. A method for electrolytic copper plating on a substrate comprising the steps of providing an electrolytic copper plating solution, contacting the electrolytic copper plating solution with ozone, wherein the electrolytic copper plating solution comprises a compound comprising the formula of —X—S—Y—, wherein X and Y are independently chosen from hydrogen atom, carbon atom, sulfur atom, nitrogen atom, and oxygen atom, and X and Y may be the same only when they are a carbon atom, and wherein a compound of the structure —X—S$^-$ in the electrolytic copper plating solution is controlled in the range of 1.0 $\mu$mol/L or lower contacting the substrate with the electrolytic copper plating solution and applying sufficient current density to deposit copper on the substrate.

2. The method of claim 1, wherein the compound comprising the formula —X—S—Y— is chosen from compounds of formulas (1) to (8)

(1) M—SO$_3$—(CH$_2$)$_a$—S—(CH$_2$)$_b$—SO$_3$—M;
(2) M—SO$_3$—(CH$_2$)$_a$—O—CH$_2$—S—CH$_2$—O—(CH$_2$)$_b$—SO$_3$—M;
(3) M—SO$_3$—(CH$_2$)$_a$—S—S—(CH$_2$)$_b$—SO$_3$—M;
(4) M—SO$_3$—(CH$_2$)$_a$—O—CH$_2$—S—S—CH$_2$—O—(CH$_2$)$_b$—SO$_3$—M;
(5) M—SO$_3$—(CH$_2$)$_a$—S—C(=S)—S—(CH$_2$)$_b$—SO$_3$—M;
(6) M—SO$_3$—(CH$_2$)$_a$—O—CH$_2$—S—C(=S)—S—CH$_2$—O—(CH$_2$)$_b$—SO$_3$—M;
(7) X—S—(CH$_2$)$_a$—SO$_3$—M; and
(8) X—S—CH$_2$—O—(CH$_2$)$_a$—SO$_3$—M;

wherein M is chosen from a hydrogen atom and an alkali metal; X is chosen from a) a hydrogen atom, b) an alkyl group containing 1–10 carbon atoms, c) an aryl group, d) a linear or cyclic amino group containing 1–6 nitrogen atoms, 1–20 carbon atoms, and multiple hydrogen atoms, or e) a hetero cyclic group containing 1–2 sulfur atoms, 1–6 nitrogen atoms, 1–20 carbon atoms, and multiple hydrogen atoms; and a and b are independently an integer of 3–8.

3. The method of claim 1, wherein the compound comprising the formula —X—S—Y— is present in the electrolytic copper plating solution in the range of 0.1–100 mg/L.

4. The method of claim 1 wherein the substrate is chosen from a printed circuit board or a wafer.

5. The method of claim 1 wherein the substrate comprises through holes or via holes.

6. A method of treating an electrolytic copper plating solution comprising the step of contacting the electrolytic copper plating solution with ozone, wherein the electrolytic copper plating solution comprises a compound comprising the formula of —X—S—Y—, wherein X and Y are independently chosen from hydrogen atom, carbon atom, sulfur atom, nitrogen atom, and oxygen atom, and X and Y may be the same only when they are a carbon atom wherein a compound of the structure —X—S$^-$ in the electrolytic copper plating solution is controlled in the range of 1.0 $\mu$mol/L or lower.

* * * * *